TUNNEL-EFFECT SEMICONDUCTOR SYSTEM WITH CAPACITATIVE GATE ACROSS EDGE OF PN-JUNCTION

Filed Nov. 6, 1961 2 Sheets-Sheet 1

*INVENTOR.*
HANS PETER KLEINKNECHT
*BY*
Francis L. Masselle
ATTORNEY

INVENTOR.
HANS PETER KLEINKNECHT
BY
Francis L. Masselle
ATTORNEY 3,309,586
Patented Mar. 14, 1967

3,309,586

TUNNEL-EFFECT SEMICONDUCTOR SYSTEM WITH CAPACITATIVE GATE ACROSS EDGE OF PN-JUNCTION

Hans P. Kleinknecht, Emmendingen, Baden, Germany, assignor, by mesne assignments, to International Telephone and Telegraph Corporation, New York, N.Y., a corporation of Maryland Filed Nov. 6, 1961, Ser. No. 150,275
Claims priority, application Germany, Nov. 11, 1960, I 19,004
6 Claims. (Cl. 317—235)

This invention relates to semiconductor devices operating on the "tunnel" effect, to waveguides embodying particular modifications of such devices and methods of their manufacture.

Among the more significant advances in the semiconductor art of recent years was the discovery of the so-called "tunnel diode." Due principally to the absence of inertia in the tunnel effect, these diodes are outstanding in their high frequency operating characteristics. As amplifiers, however, tunnel diodes suffer from the disadvantage of all diodes, viz., the fact that the input and output occur at the same terminal so that signal separation, i.e., the avoidance of inter-action therebetween required special ancillary circuitry of considerable cost.

It is, therefore, the fundamental object of the present invention to provide novel semiconductor devices which avoid or substantially mitigate this problem of tunnel diode amplifiers.

More specifically, it is an object of the invention to provide novel tunnel effect semiconductor devices which are relatively free of reactance coupling while having high frequency performance characteristics comparable to that of the tunnel diode.

Another object is the provision of an improved four terminal semiconductor device utilizing the tunnel effect in a triode amplifier.

A further object is the provision of novel high frequency response semiconductor devices exhibiting amplifying characteristics similar to the tunnel diode but requiring no associated circuitry to eliminate reactance effects.

Another object is the provision of improved waveguide amplifiers embodying particular modifications of the semiconductor device characterized in the preceding objects.

Still another object is the provision of a novel method for the fabrication of semiconductor devices in accordance with the preceding objects.

These and additional objects are fulfilled by semiconductor devices which, in accordance with the present invention, comprise a body of semiconductive material bounded by side and end surfaces and having at least two contiguous regions of opposite conductivity-type forming at the locus of their contiguity a rectifying junction intersecting a side surface of the body. One of the regions has, adjacent to this side surface, a laminar zone of higher effective concentration of significant impurities than the remainder of the region. The other region has a substantially uniform concentration of significant impurities of effectively higher value than the one region. Respective terminal connection means are provided making essentially ohmic contact with the end surfaces of the body and means also are provided for generating in the body an electric field substantially perpendicular to the side surface effective to influence the width of the space charge of the junction in the vicinity of the side surface.

In accordance with another of its features, the invention contemplates a waveguide amplifier comprising a hollow waveguide segment having a pair of opposed parallel electrically conductive sidewalls. A body of semiconductive material, electrically insulated from the waveguide segment has a major surface forming part of the inner surface of one of the sidewalls. The body contains a relatively low concentration of significant impurities conferring on it a particular type of conductivity. Adjacent the major surface of the body is a laminar zone of the same conductivity-type but having a higher effective concentration of significant impurities. On the major surface of the body is a plurality of discrete regions of the opposite conductivity-type and having a higher effective concentration of significant impurities than the laminar zone. Ohmic contacts are provided on the ends of the body and means for applying a bias potential between the ohmic contacts and means are provided for applying a bias potential between one of the ohmic contacts and the inner surface of the other sidewall of the waveguide segment.

In accordance with still another of its features, the invention contemplates a method of forming semiconductor elements which comprises providing a body of semiconductive material of a particular conductivity-type having a laminar surface zone of higher conductivity of the same type. A layer of conductivity-type determinant adapted to confer the opposite type of conductivity to the material is applied by vapor deposition to the surface of the body followed by heating of the body in a mildly oxidizing atmosphere under conditions causing agglomeration of the layer to form a plurality of minute discrete globules and subsequently by further heating of the body under conditions causing the globules to alloy to the body and form a plurality of discrete regions of the opposite-type of conductivity on the body surface.

Additional objects of the invention, its advantages, scope and the manner in which it may be practiced will be more readily appreciated by persons conversant with the art from a reading of the following description of certain exemplary embodiments thereof taken in conjunction with the subjoined claims and the annexed drawings in which like parts are denoted by like reference numerals throughout the several views, and FIGURE 1 is a diagrammatic representation, on a grossly exaggerated scale, of a semiconductor device and associated circuitry embodying the present invention, the device being shown in vertical section;

Figure 1:
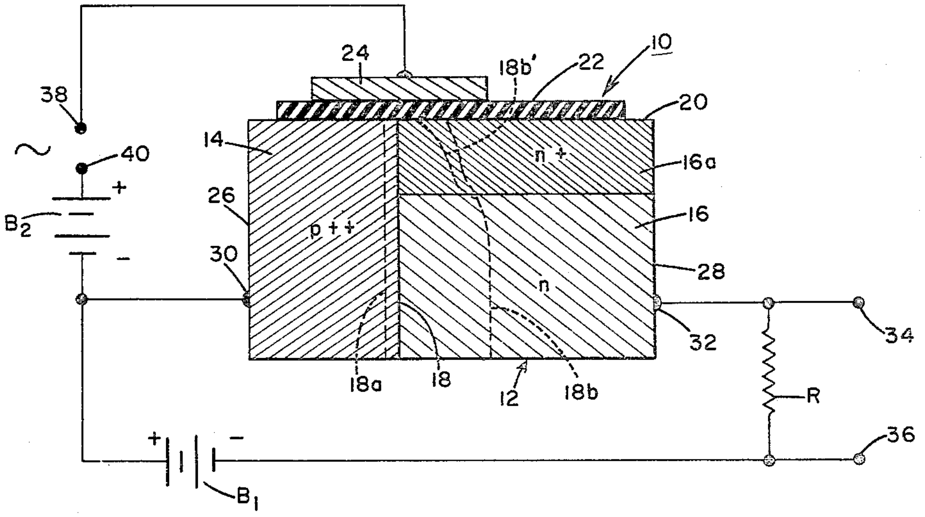

Referring now to the drawings and first particularly to FIGURE 1, reference numeral 10 designates, in its entirety, a semiconductor device, the principal structural component of which is a body 12 of semiconductive material. Body 12 may be viewed as composed of two contiguous regions 14 and 16 of opposite conductivity-type and forming along the locus of their contiguity a rectifying junction 18 of substantially planar configuration. For literary ease and clarity of description region 14 will be taken as being of P-type conductivity and region 16 of N-type conductivity; it will be appreciated, however, that the relative positions and conductivities of the regions may be reversed if desired.

One of the two regions, in the illustrated embodiment region 14, is heavily doped with suitable acceptor impurities practically to the point of degeneration and, accordingly, is designated as being of p++ conductivity. The effective concentration of significant impurities in region 14 is substantially uniform throughout.

Except for a laminar zone 16*a* adjacent a surface 20 of the body, region 16 is lightly doped with suitable donor impurities, thus conferring N-type conductivity. Laminar zone 16*a* contains a higher effective concentration of significant donor impurities than 16 and is, therefore, of higher conductiviity and designed accordingly as n+ conductivity.

While the effective concentration of significant impurities in region 16*a* is high, as compared to the remainder of region 16, it is not so high as in region 14 which, as previously mentioned, has a concentration of acceptors approaching the point of degeneration of the semiconductor.

The space charge associated with PN junction 18 is delimited by broken lines 18*a* and 18*b*, from which it will be seen that the space charge zone extends a much greater distance into region 16 than region 14. Due to the higher doping concentration and concomitantly lower resistivity of laminar zone 16*a*, the space charge region is narrowed due to the relatively higher conductivity of the material on the opposite sides of the junction in this area. By proper selection and control of the concentration of significant impurities the space charge zone adjacent surface 20 is made sufficiently narrow to enable a tunnel current to flow.

On surface 20 of the semiconductor body is a thin layer 22 of an electrical insulating material. Layer 22 may be formed conveniently by oxidizing at least that part of surface 20 intersected by rectifying junction 18.

Atop insulating layer 22, or at least a portion thereof in the vicinity of junction 18, is an electrically conductive layer 24 forming an electrode. In the illustrated embodiment electrode 24 is shown as covering a substantial area but it will be understood that, if desired, the electrode can be narrowed to a linear contact region substantially overlying junction 18 or, if desired, a point contact electrode, also located in the vicinity of the junction, can be utilized.

On the end surfaces 26 and 28 of body 12 are provided suitable ohmic contacts 30 and 32. These are connected, in series with a load impedance represented by a resistor R, across a source, battery $B_1$, of a suitable bias potential. An output signal is derived across load impedance R at output terminals 34, 36.

An electric field perpendicular to surface 20 is produced in body 12 by connecting electrode 24 to one terminal of a source, battery $B_2$, of bias potential the other terminal of which is connected to ohmic contact 30. The input signal is applied between terminals 38, 40, thus being in series with and superimposed on the bias potential provided by battery $B_2$.

The field within the semiconductor body produced by the charge on electrode 24 influences the thickness of the space charge region near surface 20 and concomitantly the diode current between contact 30 to contact 32. With a positive charge on electrode 24, as shown in FIGURE 1, the width of the space charge is diminished as indicated by dotted line 18*b'*. This is reflected by an increase in tunnel current. A charge of negative polarity on electrode 24 has relatively small effect owing to the high acceptor concentration in p++ region 14. The influence of surface effects on the field generated by electrode 24 can be disregarded because of their inability to react at the high operating frequencies for which the device is intended.

Semiconductor device 10 can be fabricated by means of various techniques well known in the art. Rectifying junction 18 can, for example, be produced by growing from the melt or from a metal solution of the semiconductor; it can be crystallized from the gas phase or formed by alloying.

Laminar zone 16*a* of higher doping concentration is obtained conveniently by impurity diffusion. Laminar zone 16*a* should be maintained as thin as possible in order to preserve a high output impedance. This can be accomplished by use of a very short diffusion time.

The significant impurities and temperatures involved in the preparation of junction 18 should be selected to avoid its possible deterioration during diffusion of zone 16*a*. This can also be avoided by diffusing zone 16*a* prior to formation of the junction.

Insulating layer 22 can be produced either by vapor deposition of silica or a suitable silicate compound or by simply oxidizing surface 20 of the semiconductor body which can be conveniently done during the diffusion of laminar zone 16*a*.

Where electrode 24 makes either surface or line contact with layer 22, it can be applied by vaporization. Where a point contact is employed, the "whisker" is fabricated and applied in any suitable and conventional manner well-known in the art and utilized heretofore in the fabrication of point contact transistors, for example.

Due to similarity in the basic principles involved, a consideration of the high frequency properties of semiconductor amplifiers in accordance with the present invention is facilitated by use of analogy to unipolar or field effect transistors. However, there is one important point of distinction which should be noted: unlike the field effect transistor, the input and output currents do not correspond in the device being described here.

In a unipolar transistor the gain-bandwidth product is expressed by the relation $$G_i \cdot f = 1/2\pi \cdot dI/dQ$$

wherein $G_i$ is the current gain, $f$ the upper frequency limit or bandwidth, I the current in the outlet circuit and Q the charge input electrode. The power gain-bandwidth product for unipolar transistors is given by the equation $$f\sqrt{G_p} = G_i \cdot f\sqrt{C_i C_o}$$

wherein $G_p$ is power gain, $C_i$ is the input capacity and $C_o$ is the output capacity.

In a tunnel effect amplifier according to the present invention, due to the fact that the input and output current do not correspond, the ratio $dI/dQ$ must be calculated from the dependence of the current I on the width of the space charge and the relation between the space charge width W and the charge Q. By way of a specific example, the analysis can be applied to the device shown in FIGURE 1 assigning the following specific values and identities:

(1) The semiconductor body 12 is germanium;

(2) Laminar zone 16*a* is diffused to a depth of one micron and has a donor concentration of $1.6 \times 10^{19}$/cc.;

(3) Dielectric layer 22 is silica 0.1 micron thick and has a relative dielectric constant of 5.

The resulting capacitance ratio $C_i/C_o$ is equal to $10^{-2}$. The current gain-bandwidth product, $(G_i \cdot f)$, therefore is in the order of 1,000 megacycles and the power gain-bandwidth product $(\sqrt{G_p} \cdot f)$ is in the order of 100 megacycles. The latter value establishes the maximum oscillator frequency.

Thus it is possible to utilize the amplifier devices according to this invention in high frequency applications. Among these applications are waveguides and cavity resonators for microwaves as will now be described.

Figure 2:
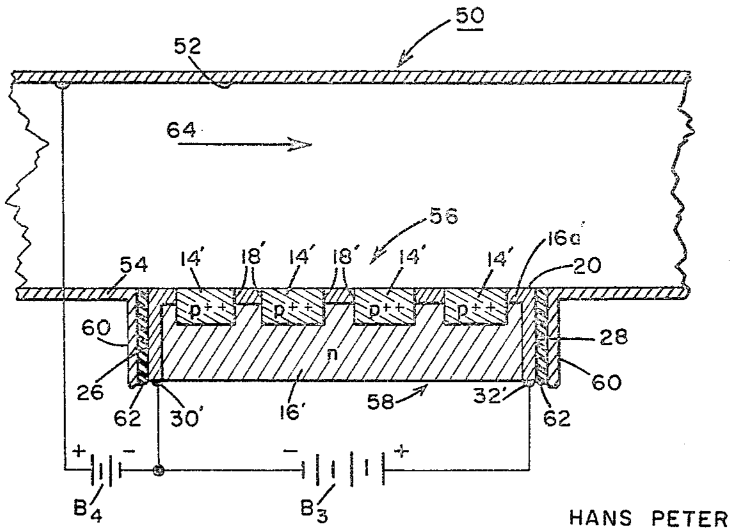
FIGURE 2 is a longitudinal section of a waveguide segment embodying the present invention.

FIGURE 2 illustrates a segment 50 of a more or less conventional waveguide. In the illustrated form waveguide 50 is of quadrangular cross-section and includes opposite parallel sidewalls 52 and 54 of electrically conductive material; the intervening space may be occupied by a dielectric medium. Part of the inner surface of sidewall 54 is formed by a tunnel effect semiconductor device 56 embodying the principles of the present invention. Device 56 comprises a body 58 of semiconductive material which is the counterpart of, and may be in all respects identical to, semiconductor body 12 of FIGURE 1. Thus body 58 includes a region 16' doped with significant impurities, donors in the present example, conferring on it N-type conductivity. By diffusion or otherwise, body 58 is provided with a laminar surface zone 16a' of higher concentration of donor impurities conferring on this zone n+ conductivity in the illustrated example. Laminar zone 16a' extends over the major side surface 20 of body 58 and end surfaces 26 and 28 thereof. On surface 20 of body 58 is a plurality of small discrete regions 14' of opposite conductivity-type; in keeping with the assumed example, regions 14' are doped with impurities, acceptors, conferring positive-type conductivity. As in the case of the single acceptor-doped region 14 of the FIGURE 1 embodiment, regions 14' of the FIGURE 2 embodiment are doped with acceptors practically to the point of degeneration. Due to the relatively high conductivity of regions 14' these have been designated p++. As best appears in FIGURE 3, regions 14' are irregularly shaped and randomly oriented and distributed over surface 20. For reasons which will become clear as this description proceeds, it is desirable that regions 14' be as closely packed as possible so as to provide a maximum total perimeter in as small a surface area as possible. In accordance with the present invention the regions may be formed by vapor deposition of a suitable significant impurity—in the illustrated embodiment an acceptor impurity such as indium or tin gallium alloy—on surface 20. Semiconductor body 58 is then heated in a mildly oxidizing atmosphere causing the vaporized film to bead up and form tiny globules. The semiconductor body is then subjected to further heating under suitable conditions to cause alloying of the globules with the surface of the semiconductor body with the concomitant formation of junctions 18' about the perimeter of each region 14' at the locus of contiguity with laminar zone 16a'. Any excess metal is subsequently removed by etching. The shape of p++ type regions 14' is immaterial; it is important only that there be a large number of such discrete regions closely spaced so as to form as many PN junctions 18' as possible adjacent surface 20 of body 58.

Semiconductive body 58 is suitably mounted in waveguide segment 50 so that surface 20 forms part of the inner surface of sidewall 54 but is electrically insulated therefrom. To this end, sidewall 54 may be formed with a niche or depression 60 adapted to receive body 58 with an insulating layer 62 interposed between the adjacent surfaces.

Ohmic contacts 30', 32' are provided at the respective ends of body 58 and, in service, are connected to the respective terminals of a source, battery $B_3$, of bias potential. In the illustrated embodiment contact 30' is biased negatively with respect to contact 32'. The ohmic contact—30' in the present case—which is upstream with respect to the direction of movement, represented by arrow 64, of the electromagnetic wave front, is connected, in series with a source of bias potential battery $B_4$, to the opposite sidewall 52 of the waveguide. Battery $B_4$ establishes a suitable potential gradient along surface 20 of the semiconductive body in relation to the field dependence of the tunnel resistance.

The theory and operation of waveguides generally is well known and will not be explained here except insofar as germane to, and required for an understanding of, the present invention. However, before continuing, the analogy between the arrangement shown in FIGURES 1 and 2 should be noted. In FIGURE 1 there is a single junction 18, (p++ n+) adjacent surface 20; a bias potential is applied across the junction by ohmic contact 30, 32 connected to potential source $B_1$; an electrostatic field is applied parallel to junction 18 by means of electrode 24 and potential source $B_2$; and the input signal is applied between terminals 38, 40 connected in series with electrode 24 and source $B_2$ so that the input signal modulates the space charge width adjacent surface 20. In FIGURE 2 there is a plurality of p++ n+ junctions 18' formed by p regions 14' and the interspersed contiguous segments of laminar zone 16a'; a bias potential across the respective junctions is provided by means of battery $B_3$ connected to ohmic contacts 30', 32' at the respective ends of semiconductor body 58; and an electric field is applied parallel to the junctions 18' by means of battery $B_4$ and by virtue of its connection to the opposite wall 52 of waveguide 50 which, therefore, can be considered as a counterpart of electrode 24 of the FIGURE 1 embodiment. In the FIGURE 2 embodiment, however, the microwave energy flowing through waveguide 50 constitutes the input signal and, by changing the electric field effective on the junctions, modulates the space charges associated therewith. This causes the wave traversing the waveguide to be amplified by energy supplied to it from potential source $B_3$ in the manner which will now be described with continued reference to FIGURE 4.

Figure 4:
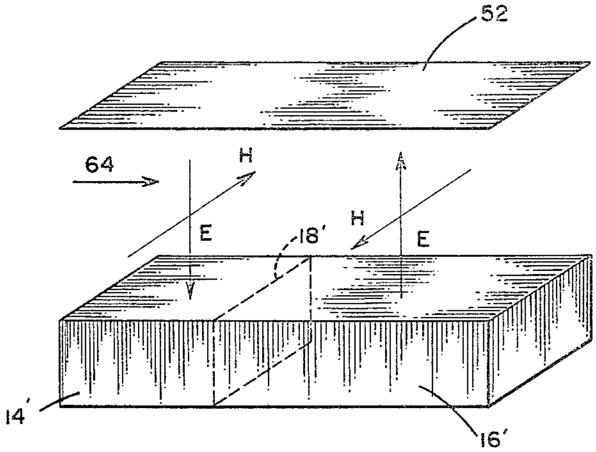
FIGURE 4 is a wholly schematic perspective elevational view of certain fragments of the structure shown in FIGURE 2 employed to facilitate description and understanding of certain operating principles of the invention.

As is well-known the surface current in a waveguide is associated with a magnetic field, represented in FIGURE 4 by vectors H, and the charges in the wall of the waveguide are associated with an electrical field, represented by vectors E. As previously explained, the field E generated by the electromagnetic wave modulates the width of the space charge regions associated with the respective junctions 18'. This is reflected by corresponding changes in tunnel resistance and, in turn, modulation of the current flowing as a result of the voltage impressed by battery $B_3$.

At locations where the field vector E is directed upwardly, the current is diminished and where downwardly it is augmented. The result is an alternating current component which is superimposed on the waveguide wall current caused directy by the electromagnetic wave itself. Because of the inter-relation between the field and current, this results in amplification of the electromagnetic wave. This amplification effect occurs at each of the junctions regardless of whether the direct current flow is from P to N or vice versa. It is pointed out that local modulation of the individual current, i.e., without a net current of zero, is possible because the process is associated with alternate charge and discharge of the various junction capacities lying parallel to the tunnel resistance.

It will be seen from consideration of a suitable equivalent circuit diagram that in this way energy is actually imparted to the electro-magnetic wave from potential source $B_3$. Moreover, it will be seen from the foregoing explanation that for a given polarity of bias source $B_3$, only electromagnetic waves moving in a particular direction through the waveguide are amplified.

Assuming a current density of 600 amps per square centimeter, the power amplification, i.e., the increase in energy flow of the electromagnetic wave at each PN junction is about 4.7 percent. With higher current densities—densities of $4 \times 10^4$ amps per square centimeter have been achieved in germanium tunnel diodes—a power amplification of 300 percent would be achieved. Accordingly, with an average density of 100 PN junctions per centimeter (obtainable with an average transverse surface dimension of about 100 microns for each $p^{++}$ region 14' produced as hereinbefore described) an amplification factor of 300 per centimeter or 25 db per centimeter is indicated. However, owing to the random distribution and orientation of region 14' only a fraction of the PN junctions formed thereby are effective. Assuming this fraction to be approximately one-fifth, a linear dimension of 5 centimeters will be necessary to obtain 25 db amplification.

An increase in amplification can be obtained by providing both walls of the waveguides with a semiconductive element such as 56, that is, duplicating the structure shown in FIGURE 2 for sidewall 52 of semiconductor segment 50. Furthermore, the entire waveguide can be fabricated of such elements. Judicious selection of the dielectric in the waveguide also can be resorted to and this by means of increasing the amplification factor.

The application of the principles of the present invention to a cavity resonator will be described with reference to FIGURE 5 wherein such a resonator is designated in its entirety by reference numeral 70. The use of cavity resonators for the oscillation of microwaves is, in itself, well-known. While a variety of specific configurations of cavity resonators are known, the fundamental concept of operation is the same and the present invention is applicable in principle to all.

In cavity resonators a high frequency wave of electromagnetic energy is introduced into a closed chamber having opposed electrically conductive walls and proportioned for resonance at a particular frequency. Taps are provided for taking off the electrical component at points of high amplitude.

Figure 5:
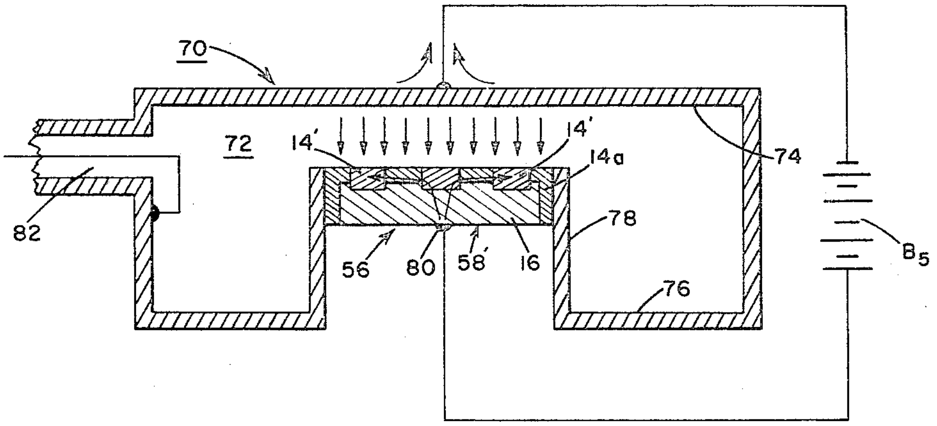
FIGURE 5 is a schematic sectional view on a grossly enlarged scale of a cavity resonator embodying the present invention.

Reverting to FIGURE 5, cavity resonator 70 consists of a closed chamber 72 having a pair of opposing walls 74 and 76, of electrically conductive material, the latter having a re-entry portion forming an inward projection 78. Projection 78 terminates at a distance from the opposite wall 74 and mounts a semiconductive element 56′ which, except for terminal connections thereto, is identical to element 56 in FIGURE 2.

In contrast of the arrangement shown in FIGURE 2, element 56′ is mounted in electrically conductive relation with the wall 76. An ohmic connection 80 is formed on region 16 of body 58′ and, in service, is connected to one terminal of a source $B_5$ of D.C. potential, the other terminal of which is connected to the opposite wall 74 of cavity resonator 70, thus establishing a potential difference between the semiconductor body and wall 74.

A coaxial conductor arrangement 82 is provided for tapping off energy from the resonator for supply to utilization circuits, not shown.

Figure 3:
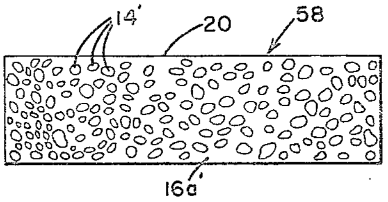
FIGURE 3 is a diagrammatic representation in plan view of a portion of the surface of a semiconductor device of the type shown in FIGURE 2.

The operation of the cavity resonator is believed to be evident from the description previously presented hereinabove in conjunction with FIGURES 2 and 3. An electromagnetic wave of particular frequency introduced into chamber 72 in any known manner achieves resonant oscillation therein. The electromagnetic field produced in consequence is accompanied by an electric field and is represented by vectors E in FIGURE 5. As already described, the electric field modulates the tunnel resistance by varying the width of the space charges associated with the junctions on surface 20. Changes in current are reflected by corresponding changes in the magnetic field in the cavity. In this way it is possible to sustain oscillations by feeding energy from source $B_5$ into the system to compensate for losses and, if desired, to permit tapping off part of the electromagnetic energy due to the oscillations. Consequently, the device operates as an oscillator or resonance amplifier for very high frequencies.

As mentioned in connection with the embodiment of FIGURE 2, the effect described can be magnified by providing semiconductor elements on both of the opposing walls of resonator 70. If this is done, chamber 72 would be formed symmetrically so that wall 74 would be a mirror image of 76. Moreover, both semiconductor elements would be provided with ohmic contacts on their least conductive regions (e.g., region 14).

A prime requisite of the invention is the presence of rectifying PN junctions formed by and between regions of different conductivity-type and containing a sufficiently high concentration of significant impurities that the width of the associated space charge is in the order of a wave length of the charge carriers. This enables the charge carriers to tunnel through the space charge in numbers which vary as a function of the width of the space charge region. In this way modulation of the total current, which is related to the number of charge carriers tunneling through the junction, is accomplished by control of the width of the space charge region.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

What is desired to be secured by United States Letters Patent is:

1. A semiconductor device comprising:
- a semiconductor body having first and second regions of given and opposite respective conductivity types with a P-N junction therebetween extending to a given surface of said body,
  - said first region having a sufficient high concentration of conductivity-type-determining impurities such that said region is degenerative,
  - said second region comprising a first zone having a conductivity-type-determining impurity concentration substantially lower than said first region such that the adjacent portion of said junction inhibits quantum-mechanical tunneling,
  - said second region having a laminar zone of said opposite conductivity type adjacent said surface, said laminar zone having a conductivity-type-determining impurity concentration higher than said first zone and lower than said first region forming a quantum-mechanical tunneling area in the portion of said junction between said first region and said laminar zone;
- a layer of insulating material on said surface and overlying said junction,
- a control electrode disposed on said insulating layer adjacent said junction, and
- first and second electrodes contacting said first and second regions respectively.

2. A semiconductor device according to claim 1, wherein the impurity concentration of said laminar zone is less than sufficient to render said zone degenerative.

3. A semiconductor device according to claim 1, wherein said laminar zone comprises a layer having a thickness on the order of 1 micron.

4. A semiconductor device according to claim 1, wherein said laminar zone impurity concentration is on the order of $1.6 \times 10^{19}$ cubic centimeter.

5. A semiconductor device according to claim 1, wherein said insulating layer comprises an oxide of said semiconductor having a thickness on the order of 0.1 micron.

6. A semiconductor device comprising:
- a semiconductor body having first and second regions of given and opposite respective conductivity types with a P-N junction therebetween extending to a given surface of said body,
  - said first region having a sufficiently high concentration of conductivity-type-determining impurities such that said region is degenerative,
  - said second region comprising a first zone having a conductivity-type-determining impurity concentration substantially lower than said first region such that the adjacent portion of said junction inhibits quantum-mechanical tunneling,
  - said second region having a laminar zone of said opposite conductivity type adjacent said surface, said laminar zone having a conductivity-type-determining impurity concentration higher than said first zone and lower than said first region such that the space charge width associated with the P-N junction between said first region and said laminar zone is on the order of the wavelength of the charge carriers;

a layer of insulating material on said surface and overlying said junction, a control electrode disposed on said insulating layer adjacent said junction, first and second electrodes contacting said first and second regions respectively, and means for applying a control signal to said control electrode to vary said space charge width.

References Cited by the Examiner

UNITED STATES PATENTS

| | | | |
|---|---|---|---|
| 2,623,102 | 12/1952 | Shockley | 317—235 |
| 2,795,742 | 6/1957 | Pfann | 317—235 |
| 2,804,405 | 8/1957 | Derick et al. | 148—1.5 |
| 2,956,913 | 10/1960 | Mack et al. | 148—1.5 |
| 2,995,713 | 8/1961 | Thompson | 330—56 |
| 3,025,438 | 3/1962 | Wegener | 317—235 |
| 3,045,129 | 7/1962 | Atalla et al. | 307—88.5 |
| 3,056,888 | 10/1962 | Atalla | 307—88.5 |
| 3,089,794 | 5/1963 | Marinace | 317—235 |
| 3,102,230 | 8/1963 | Kahng | 317—235 |
| 3,206,670 | 9/1965 | Atalla | 317—235 |

JOHN W. HUCKERT, *Primary Examiner.*

J. D. KALLAM, S. H. GRIMM, J. KOMINSKI, *Assistant Examiners.*